United States Patent
Eichler et al.

(10) Patent No.: US 8,652,253 B2
(45) Date of Patent: Feb. 18, 2014

(54) ARRANGEMENT AND METHOD FOR MANUFACTURING A CRYSTAL FROM A MELT OF A RAW MATERIAL AND SINGLE CRYSTAL

(75) Inventors: Stefan Eichler, Dresden (DE); Thomas Bünger, Lüneburg (DE); Michael Butter, Freiberg (DE); Rico Rühmann, Neuhausen (DE); Max Scheffer-Czygan, Chemnitz (DE)

(73) Assignee: Freiberger Compound Materials GmbH, Freiberg (DE)

( * ) Notice: Subject to any disclaimer, the term of this patent is extended or adjusted under 35 U.S.C. 154(b) by 1138 days.

(21) Appl. No.: 12/133,870

(22) Filed: Jun. 5, 2008

(65) Prior Publication Data
US 2008/0311417 A1    Dec. 18, 2008

Related U.S. Application Data

(60) Provisional application No. 60/942,298, filed on Jun. 6, 2007.

(30) Foreign Application Priority Data

Jun. 6, 2007    (DE) .......................... 10 2007 026 298

(51) Int. Cl.
| | |
|---|---|
| C30B 11/00 | (2006.01) |
| C30B 15/00 | (2006.01) |
| C30B 21/06 | (2006.01) |
| C30B 27/02 | (2006.01) |
| C30B 28/10 | (2006.01) |
| C30B 30/04 | (2006.01) |
| C30B 35/00 | (2006.01) |

(52) U.S. Cl.
USPC ................. 117/11; 117/13; 117/14; 117/200; 117/206

(58) Field of Classification Search
USPC ................. 117/11, 13, 14, 200, 206
See application file for complete search history.

(56) References Cited

U.S. PATENT DOCUMENTS

| | | | |
|---|---|---|---|
| 3,796,552 A | 3/1974 | Robinson et al. | |
| 4,666,681 A * | 5/1987 | Ferrand et al. ................ | 117/223 |

(Continued)

FOREIGN PATENT DOCUMENTS

| | | |
|---|---|---|
| DE | 30 31 747 A1 | 3/1982 |
| DE | 34 41 707 A1 | 5/1986 |

(Continued)

OTHER PUBLICATIONS

Wilke, K.-Th., Bohm, J., Kristallzüchtung, Wilke, K.-Th.(Hrsg.), Ed. VEB Deutscher Verlag der Wissenschaften, 1973, pp. 460-469, 484-501.

(Continued)

*Primary Examiner* — James McDonough
(74) *Attorney, Agent, or Firm* — Foley & Lardner LLP

(57) ABSTRACT

An arrangement for manufacturing a crystal of the melt of a raw material comprises: a furnace having a heating device with one or more heating elements, which are configured to generate a gradient temperature field directed along a first direction, a plurality of crucibles for receiving the melt, which are arranged within the gradient temperature field side by side, and a device for homogenizing the temperature field within a plane perpendicular to the first direction in the at least two crucibles. The arrangement further has a filling material inserted within a space between the crucibles wherein the filling shows an anisotropic heat conductivity. Additionally or alternatively, the arrangement may comprise a device for generating magnetic migration fields, both the filling material having the anisotropic heat conductivity and the device for generating magnetic migration fields being suited to compensate or prevent the formation of asymmetric phase interfaces upon freezing of the raw melt.

30 Claims, 13 Drawing Sheets

(56) References Cited

U.S. PATENT DOCUMENTS

| | | | |
|---|---|---|---|
| 4,840,699 | A | 6/1989 | Khattak et al. |
| 5,017,209 | A | 5/1991 | Yoshimura |
| 6,712,904 | B1 * | 3/2004 | Sonnenberg et al. ......... 117/222 |
| 7,179,331 | B2 | 2/2007 | Mühe et al. |
| 7,261,774 | B2 | 8/2007 | Mühe |
| 8,025,729 | B2 * | 9/2011 | Jurisch et al. .................... 117/89 |
| 2005/0087125 | A1 * | 4/2005 | Muhe et al. .................... 117/200 |
| 2006/0144326 | A1 * | 7/2006 | Einhaus et al. ............... 117/200 |
| 2006/0278891 | A1 | 12/2006 | Saxler et al. |
| 2007/0012242 | A1 | 1/2007 | Jurisch et al. |
| 2007/0266931 | A1 * | 11/2007 | Mueller et al. .................. 117/83 |
| 2009/0104423 | A1 | 4/2009 | Jurisch et al. |

FOREIGN PATENT DOCUMENTS

| | | |
|---|---|---|
| DE | 33 23 896 C2 | 8/1991 |
| DE | 197 04 075 A1 | 8/1998 |
| DE | 199 12 484 A1 | 9/2000 |
| DE | 102 39 104 A1 | 4/2004 |
| EP | 0 130 865 B1 | 1/1985 |
| EP | 1 147 248 B1 | 10/2001 |
| GB | 2 218 789 A | 11/1989 |
| JP | 02-004193 A | 1/1990 |
| JP | 10-338592 A | 12/1998 |
| JP | 2000-203981 A | 7/2000 |
| JP | 2002-540051 A | 11/2002 |
| JP | 2003-206200 A | 7/2003 |
| JP | 2004-115339 A | 4/2004 |
| JP | 2007-081372 A | 3/2007 |
| JP | 2007-509026 A | 4/2007 |
| WO | WO 2005/041278 A2 | 5/2005 |
| WO | WO 2006/017074 A2 | 2/2006 |

OTHER PUBLICATIONS

Fischer, A. G., "Techniques for Melt-Growth of Luminescent Semiconductor Crystals under Pressure", Journal of the Electrochemical Society, vol. 117, No. 2, 1970, pp. 41C-47C.

Blum, S. E. et al., "Growth of Low Strain GaP by Liquid Encapsulation, Vertical-Gradient Freeze Technique", Brief Communications of the Electr. Chem. Society, vol. 120, No. 4, 1972, pp. 588-589.

Jantz, W. et al., "Contactless Resistivity Mapping of Semi-Insulating Substrates", III-VS Review, vol. 6, No. 4, 1993, pp. 38-39.

Stibal, R. et al.,"Contactless Mapping of Mesoscopic Resistivity Variations in Semi-Insulating Substrates", Materials Science and Engineering, B 66[1-3], 1999, pp. 21-25.

Wickert, M. et al., "High Resolution EL2 and Resistivity Topography of SI GaAs Wafers", IEEE Inc., 1999.

Geiler, H. D. et al., "Photoelastic Characterization of Residual Stress in GaAs Wafers", Materials and Science in Semiconductor Processing, 9 (2006), pp. 345-350.

Hagi, Y. et al., "Low Dislocation Density 3-inch Si doped GaAs Crystals by Vertical Boat Growth", IEEE Inc., 1996, pp. 279-282.

Hashio, K. et al., "Six-inch-Diameter Semi-Insulating GaAs Crystal Grown by the Vertical Boat Method", Inst. Phys. Conf. Ser. No. 162, Chapter 10, 25$^{th}$ Int. Symp. Compound Semiconductor, Oct. 1998, pp. 523-528.

Wickert, M. et al., "High Resolution EL2 and Resistivity Topography of SI GaAs Wafers", IEEE Inc., 1998.

M.U. Ahmed et al., "Measurement of etch pit densities in diffused samples of CdTe", Journal of Crystal Growth, No. 146, (1995), pp. 136-141.

T. Flade et al., "State of the art 6" SI GaAs wafers made of conventionally grown LEC-crystals", Journal of Crystal Growth, No. 198/199 (1999) pp. 336-342.

* cited by examiner

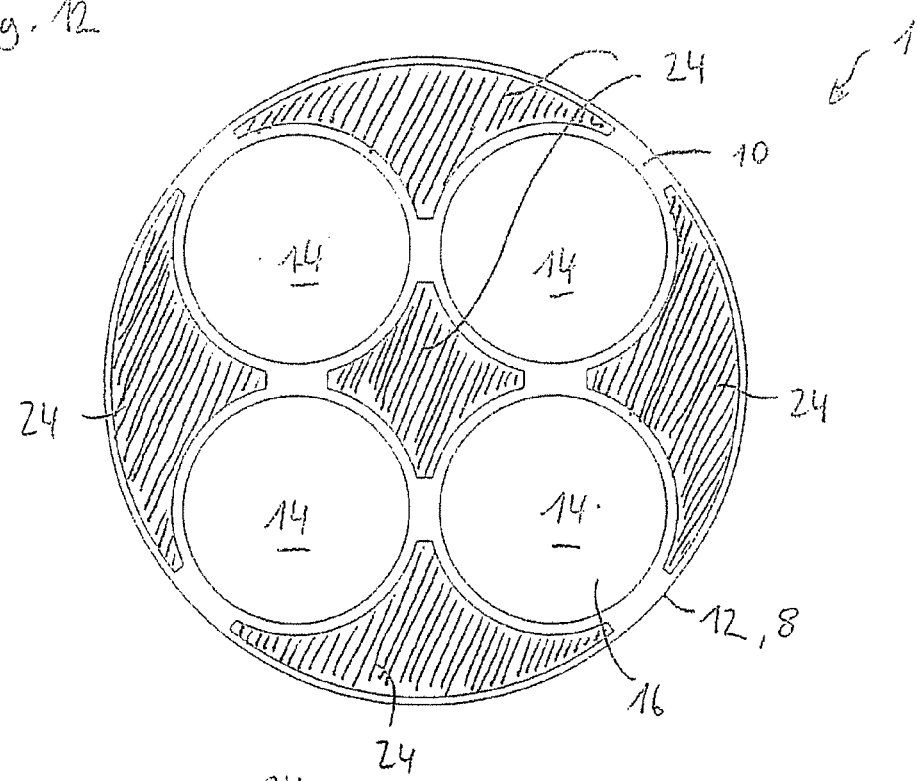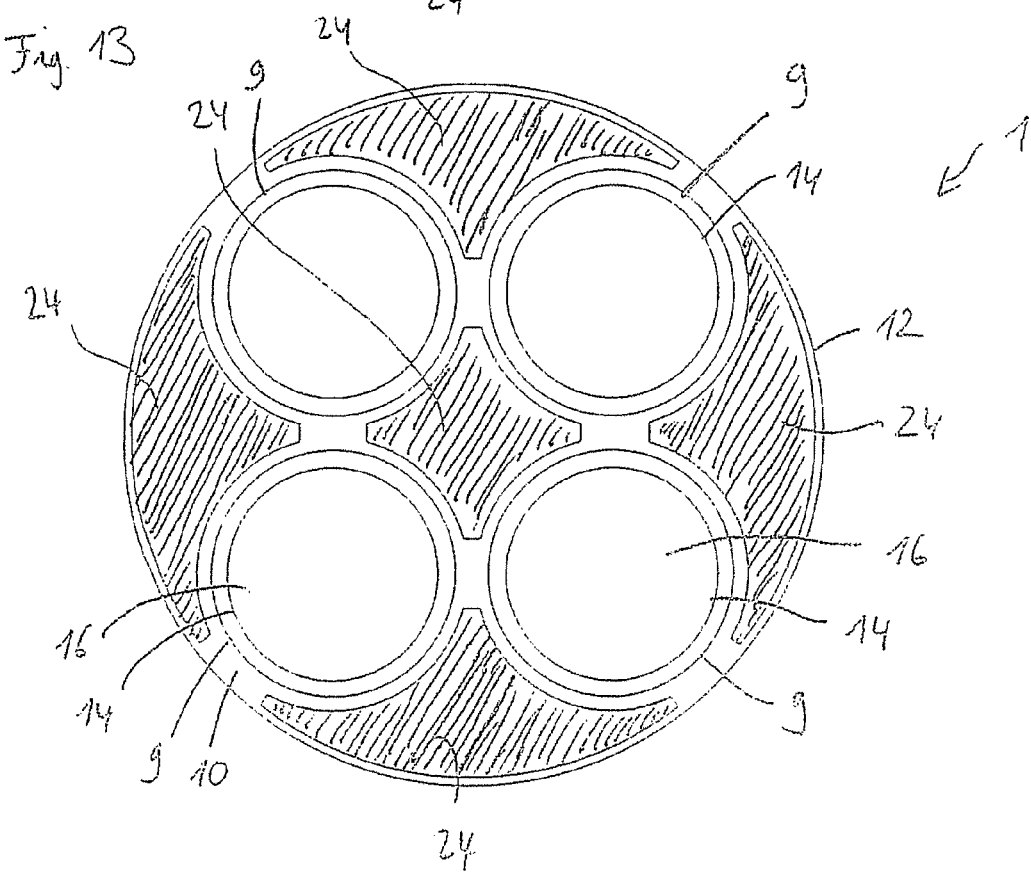

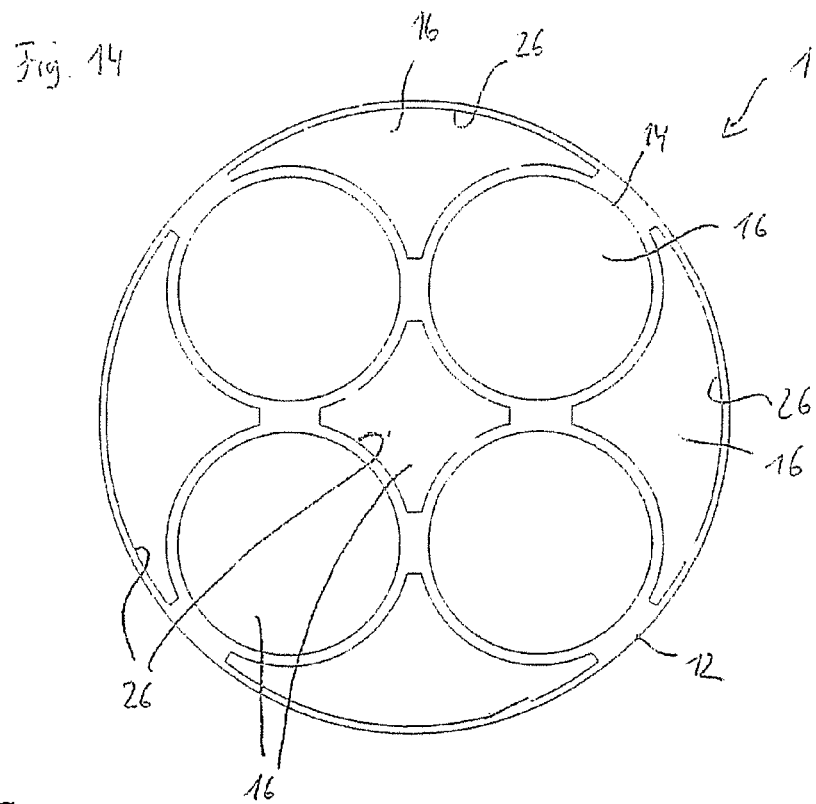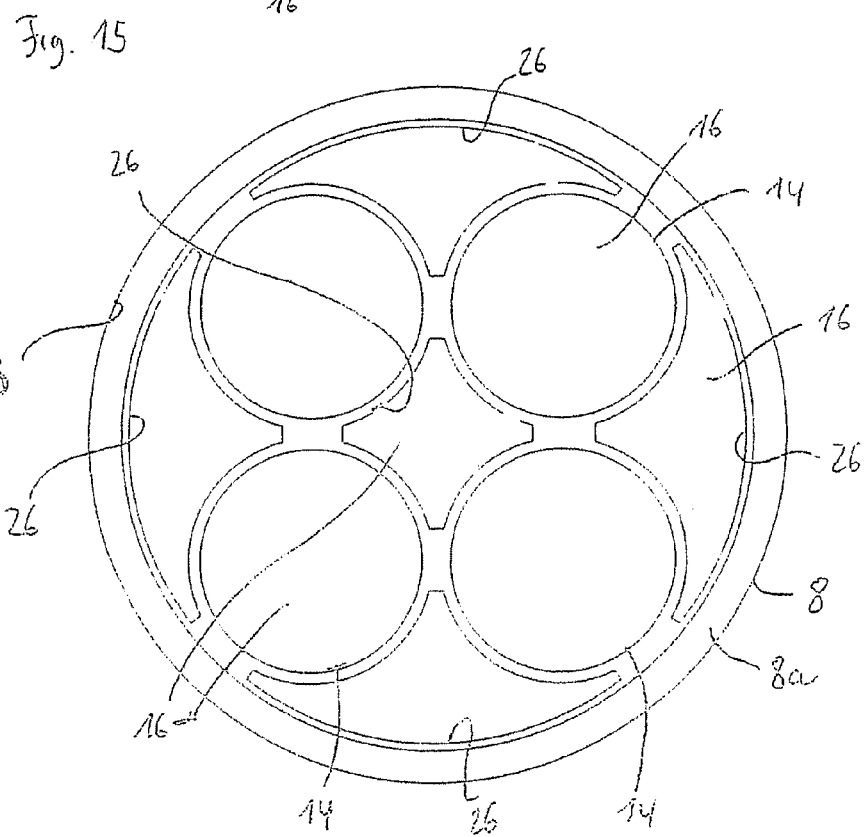

ARRANGEMENT AND METHOD FOR MANUFACTURING A CRYSTAL FROM A MELT OF A RAW MATERIAL AND SINGLE CRYSTAL

TECHNICAL BACKGROUND

1. Technical Area

The invention relates to an arrangement for a manufacturing crystalline materials, in particular to those having large dimensions. The invention relates also to manufacturing semiconductors according to the VB-method (Vertical Bridgman), or according to the VGF-method (Vertical Gradient Freeze).

2. Description of Related Art

The economy of manufacturing crystals is substantially dominated by the throughput, i.e., crystallized mass per time unit, of the material through the crystallization furnace as well as dominated by the consumption of energy which is necessary therefore. Many single or polycrystalline materials are frozen out of the melt being directed in a gradient temperature field. Such methods are called gradient-freeze- or Bridgman-method, see also Wilke, K.-Th. and J. Bohm in: "*Kristall-züchtung*", Ed. K.-Th. Wilke, First Edition, VEB Deutscher Verlag der Wissenschaften, 1973, 1-922.

For many material characteristics of the crystal to be manufactured such as the integratin of dopants, the structural perfection or the elastic stress, it is particularly important that the crystallization front in the crucible does not reveal any or only small curvatures during the freeze. In order to avoid curvatures of the phase interfaces, each point in a direction perpendicular to the direction of the freeze must pre-serve the axial heat flux condition:

$$v = (q_{melt} - q_{crystal}) / \Delta h_{latent} \rho_{crystal}$$

Therein, v denotes the axial crystallization velocity, q denotes the axial heat flux in the melt and the crystal at the position of the crystallization front, respectively, $\Delta h_{latent}$ denotes the specific latent heat of the phase transition and $\rho_{crystal}$ denotes the mass density of the frozen material. The heat flux in the crystal is determined as the product of the thermal conductivity $\lambda$ and the temperature gradient grad(T). By approximation, the quantity $\Delta T/\Delta x$ may be specified, if x is the axial coordinate in the direction of freeze. By the approximation of a vanishing heat flux within the melt, $q_{melt} = 0$, the growth velocity has an upper limit, which may be calculated by:

$$v \leq (\lambda / \Delta h_{latent} \rho_{crystal}) \cdot \text{grad}(T).$$

The temperature gradient may, however, be selected for many materials such as not to attain arbitrarily large values due to the appearance of thermo-elastic stress. In particular, the growth velocity becomes necessarily smaller for crystals attaining larger lengths. In this case, the heat resistance of the crystal becomes larger with continuing crystallization and the latent heat power which can be dissipated, i.e., the latent heat per time unit, decreases. This again limits the growth velocity for long crystals.

For economical reasons, particularly of the material throughput in crystallization furnaces, it is thus less expedient to increase the length of the crystals beyond limits which depend on the material employed. On the contrary, the material throughput might be increased by expanding the area, on which the material is simultaneously crystallized. Therein, the latent heat power becomes larger proportional to the crystallization area, but the dissipation of heat from the phase interface equivalently increases in proportion to the area.

Often there are required only specific standardized material quantities for further processing the crystalline material to yield electronic components or integrated circuits, solar cells, optical components, etc. Hence, an arbitrarily large crystallization area in the crucible becomes out of question due to the lack of a corresponding demand.

It is also known to manufacture a number of comparatively thinner crystals adapted in shape in parallel to each other rather than crystallizing a larger block of material. Such Bridgman-like methods are known for optical materials such as rare earth-fluorides according to U.S. Pat. No. 3,796,552 A or for scintillator crystals such as barium fluoride according to EP 0,130,865 A1. Therein, however, only small ratios of the diameter with respect to the corresponding length of the crystals are employed.

For comparatively larger crystals, which are employed in micro- and opto-electronic, photovoltaic or optical applications, corresponding solutions are not aimed at until now. Namely, there is a large challenge to form the temperature field at each time step of the crystallization such that important characteristics as for example electric resistance, mobility of charged particles, point defect concentrations, structural perfection, elastic stress, refraction index, reflectivity, etc. meet the target requirements of the manufacturers with concern to the respective applications.

For semiconductor crystals, which are processed to semiconductor wafers during the further production process, the radial homogeneity plays a particularly important role for the processing of the components. For example, parameters such as specific electrical resistance, charged particle mobility, concentrations of dopants or foreign particles or the residual stress are to be distributed over the wafer with particular homogeneity.

With regard to single crystalline materials there have to be considered even stronger requirements with concern to the specific crystal orientation. Mostly, a seed crystal is furnished, which then determines the crystal direction of the growing crystal. Methods, in which the single crystal is generated by spontaneous seed formation followed by a seed selection, often dropout for material economic reasons.

The difficulty to germinate at a seed crystal is to form a temperature field, such that the melted material contacts the seed and the seed is then slightly melted back. It is convenient for Bridgman- or gradient-freeze-methods to select the arrangement of heat sinks and heat sources such that the desired temperature field can be generated. Proceeding to continuously larger constructions it becomes now necessary to arrange so-called liners with corresponding thermal characteristics, such that a temperature field can be formed extending over larger areas such as described in EP 1,147,248 or U.S. Pat. No. 6,712,904.

SUMMARY OF THE INVENTION

It is consequently an object of the invention to improve the economy of manufacturing crystals and more specifically to increase the material throughput in crystallization furnaces.

It is a further object to improve a quality of the manufactured crystals with regard to the homogeneity of those characteristics particularly important for applications in the micro- or opto-electronical areas.

These and other objects are solved by an arrangement for manufacturing a crystal from a melt of a raw material, comprising: a furnace having a heating device, which includes one or more heating elements, which are arranged to generate a gradient temperature field in the furnace directed along a first direction, a plurality of at least two, preferably three or more crucibles for receiving the melt, the crucibles being arranged side by side in the gradient temperature field, and a device for homogenizing the temperature field within a plane perpendicular to the first direction in the crucibles, wherein the device for homogenizing the temperature field comprises a filling material, which is arranged within a space between the crucibles, and wherein the filling material shows an anisotropic heat conductivity, and/or a device or generating magnetic migration fields is provided that prevents from or compensates for the formation of asymmetric phase interfaces upon freezing of the melt.

Both devices suitably supplement each other when used in combination, particularly if crystals are to be produced which have a large dimension in length direction, i.e., the direction of the temperature gradient. Along this (axial) direction the intended influence due to the anisotropic filling materials may be limited to smaller ranges of distance, while magnetic migration fields may compensate for deviations from symmetry over larger distances. The homogeneity to be achieved can thereby be advanced to larger crystal lengths.

It has to be further noted, that the features shown in the embodiments of the present specification, the figures or the appended claims may be practiced in combination with the device for the generation of magnetic migration fields, even if the respective filling material has no anisotropic heat conduction characteristic. Such combinations of features are also considered falling within the scope of the claims.

According to embodiments of the invention, multiple crucibles are arranged side by side within a furnace and are—filled with the melt—being collectively exposed to a directed or gradient temperature field. The homogeneity of characteristics such as for example the specific electrical resistance, the impurity degree, the grain size, residual stress, etc. of the growing crystals in the arrangement of standing crucibles is thereby basically affected, since it was found out that an azimuthal asymmetry arises due to the mutual heat conduction and thermal radiation of the crucibles.

At this point, the invention commences in that a device is proposed, which compensates for these inhomogeneities, i.e., the breakdown in rotational symmetry of the temperature field surrounding the respective crucible may be alleviated.

As the filling material of the invention there may also be considered the same material of the raw melt itself, which is then filled into interstitial crucibles. In this case, a crystallization front similar to that within the (main) crucibles containing the material of the crystal to be produced develops due to the temperature gradient in axial direction. As a result, heat conduction in the interstitial crucible also becomes anisotropic because of the differing material properties as seen along the axial direction between the melt and the freezed crystal behind the crystallization front.

According to the present invention, there is also provided a method for manufacturing a crystalline material from a melt of a raw material as becomes apparent from the appended claims.

The invention is further directed to a crystal, which comprises a semiconductor material, has a distribution of dislocation density, wherein a global standard deviation ($\sigma_{global}$) of an etch pit density (epd) representing the dislocation density within a plane perpendicular to a longitudinal access of the single crystal amounts to less than 23% of a mean value of the etch pit density for the crystal, wherein the determination of the global standard deviation is based on a characteristic length of 5 mm. The ranges of values for the standard deviations are those or specific characteristics, which are typical for the crystalline materials manufactured according to the arrangement or method of the invention.

Another crystal proposed herein has a distribution of the specific electrical resistance. With regard to the crystal a global standard deviation ($\sigma_{global}$) within a plane perpendicular to the longitudinal access of the crystal amounts to less than 5.3% of a mean value of the specific electrical resistance of the crystal, wherein the determination of the global standard deviation is based on a characteristic length of 10 mm.

It is noted that the proposed arrangement is suited—among others—to carry out crystallization according to the VGF-method, or alternatively according to the VB-method. As a result it is even possible to manufacture single crystals having the above-specified characteristics. According to a specific embodiment, GaAs may be employed as the semiconductor material.

Further advantageous aspects of the invention become apparent from the dependent claims.

DESCRIPTION OF FIGURES

The invention will now be explained in more detail with regard to the embodiments taken in conjunction with the drawings. In the drawings:

FIG. 12 similar to FIG. 5, wherein according to a third embodiment filling material bodies are inserted in spaces between the crucibles;

FIG. 13 similar to FIG. 12, wherein the crucibles are collected each in a respective one of gas-tight pressure ampoules;

FIG. 14 similar to FIG. 5, wherein according to a fourth embodiment of the invention interstitial crucibles are inserted in spaces between the freeze crucibles;

FIG. 15 similar to FIG. 14, wherein the crucibles are collectively arranged within one pressure vessel of the furnace.

DETAILED DESCRIPTION OF THE EMBODIMENTS

In embodiments of the invention there will be described arrangements 1, with which single crystals may exemplary be manufactured from, i.e. III-V-, IV-IV- and II-VI-compounds such as gallium arsenide (GaAs), indium phosphide (InP), cadmium telluride (CdTe), cadmium mercury telluride and various antimonides as well as element semiconductors such as germanium (Ge) and silicon (Si). In addition polycrystalline materials such as silicon (Si) for photovoltaic applications may be frozen.

Thereby, multiple crucibles 14 are arranged side by side, such that a corresponding number of large crystals, or in the case of rectangular crucible sections: edge lengths, of up to 125 mm or more (for example to manufacture 8"-crystals and wafers derived thereof) may be grown simultaneously in one and the same arrangement, or in one and the same temperature field that is generated in the arrangement 1.

Figure 1:
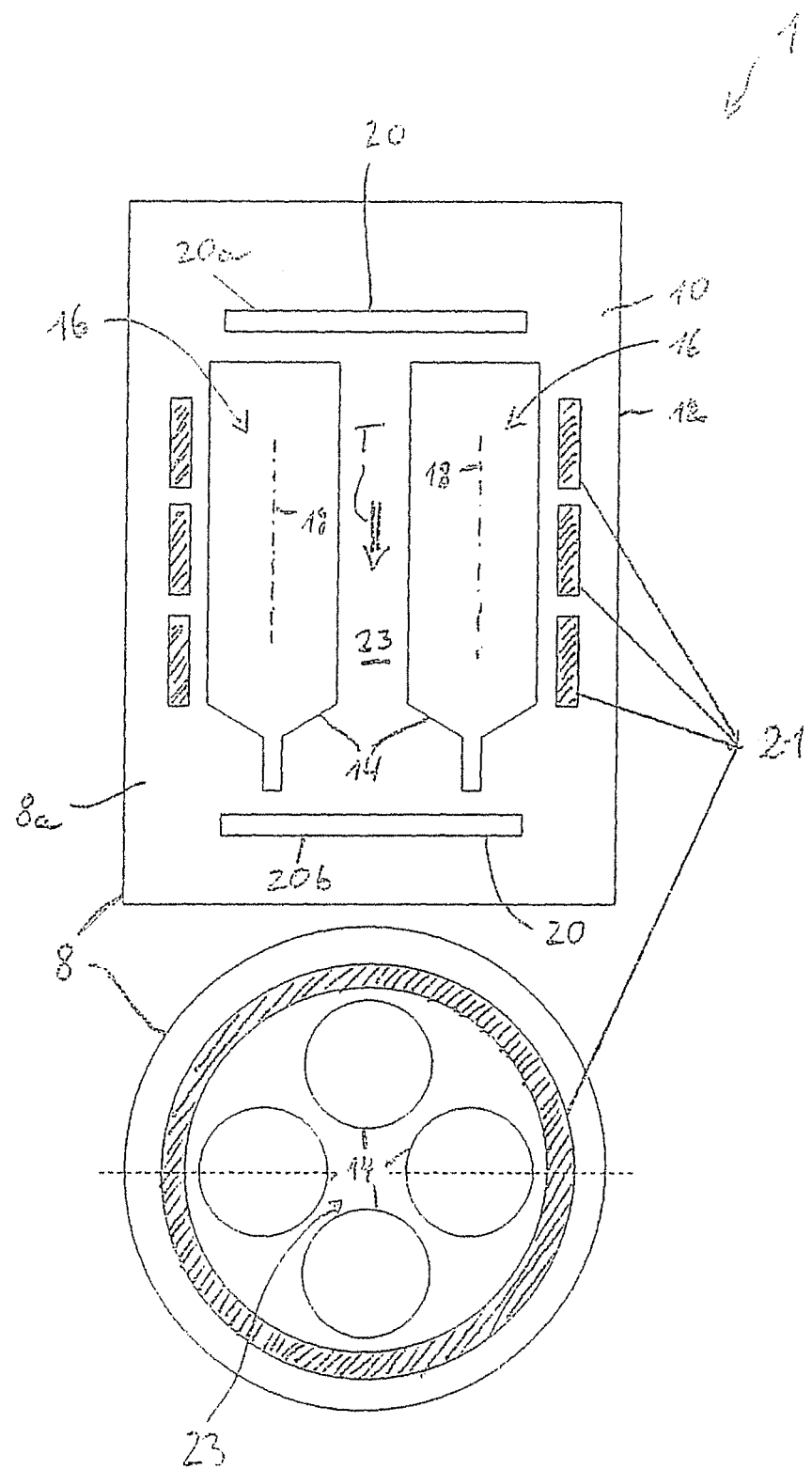
FIG. 1 shows an arrangement with crucibles positioned side by side in a VGF-furnace (Vertical Gradient Freeze) having an outer pressure vessel.

An arrangement 1 to be employed with the invention is shown in a longitudinal section (upper part) and in transverse section (lower part) in FIG. 1. The cut axis is indicated in the lower part by a dashed line. The arrangement 1 comprises a VGF-furnace 10, which has a cylindrical furnace wall 12 and in which multiple crucibles 14 are arranged. The crucibles 14 receive a melt 16, for example of gallium arsenide. By an arrangement of heating elements 20 a gradient (directed) temperature field T is generated, which extends substantially within the plane of drawing in FIG. 1 in parallel to the longitudinal axis 18 of the crucibles 14.

The heating elements 20 comprise one or more cover heaters 20a and floor heaters 20b, which in operation are configured with a mutual temperature difference to form the temperature field T. The arrangement can further comprise jacket heaters 21, which prevent a heat flux, that is directed perpendicular to the temperature field T, and which generally maintain the temperature level in a vicinity of the melting point (GaAs: about 1238° C.). These surround also the entirety of the crucibles 14 as such.

The crucibles 14 preferably stand parallel to each other with regard to their longitudinal axis 18 and overlap with concern to a height position along the direction of the temperature field T. The cover heater 20a and the floor heaters 20b have a lateral extent, which suffices to receive or cover the entirety of the crucibles there between, in order to achieve an optimum homogeneity. The cover heaters 20a and floor heaters 20b are for example made from CFC and include outstanding thermal conductivity characteristics. The extent of the cover and floor heaters 20a, 20b may for example amount to a factor of 1.5 . . . 2.0 of the crucibles 14 positioned near to each other.

The above described temperature field T may be generated in a water-cooled and—if required—vacuum- and gas-tight vessel 8 (pressure vessel) which receives in an inner space 8a the plurality of crucibles 14. The furnace wall 12 shown in FIG. 1 is according to this example gas-, vacuum- and pressure-tight.

Figure 2:
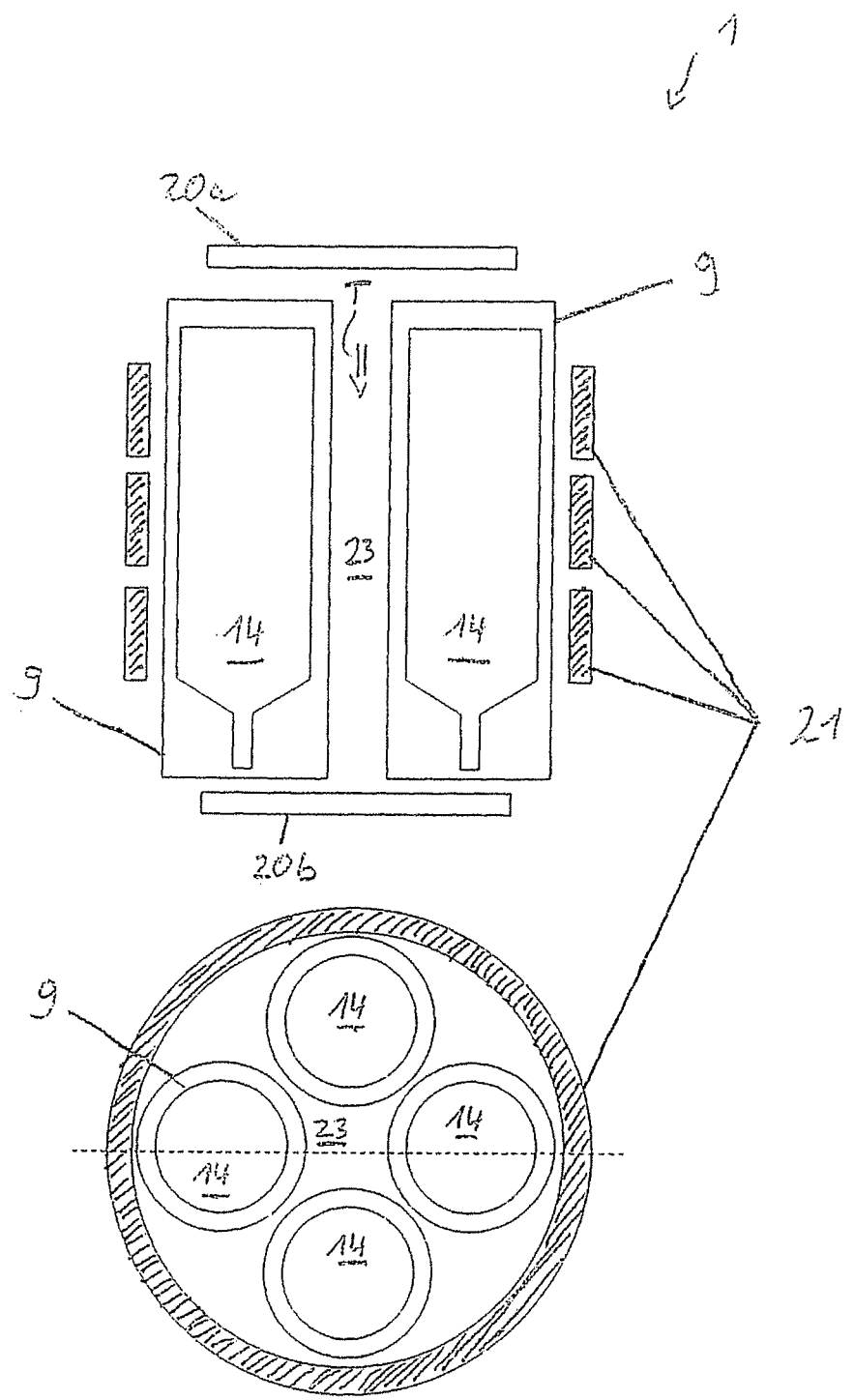
FIG. 2 shows an arrangement similar to FIG. 1, wherein the crucibles are each collected in respectively one gas-tight pressure ampoule.

An arrangement to be employed alternatively with the invention and which is shown in FIG. 2 is provided to enclose each one of the plurality of crucibles 14 preferably in the case of materials with increased vapour pressure within one gas- and pressure-tight ampoule 9, wherein the temperature field T is then applied from externally. Both methods are associated rather with the so-called "Gradient Freeze"—(GF)-method.

The invention is preferably practiced using a VGF-method. The crucible and the heaters are not moved relative to each other. Rather, by suitable control of the power source of the heaters the temperature field is adapted to the location of the advancing crystallization front, or phase interface.

Figure 3:
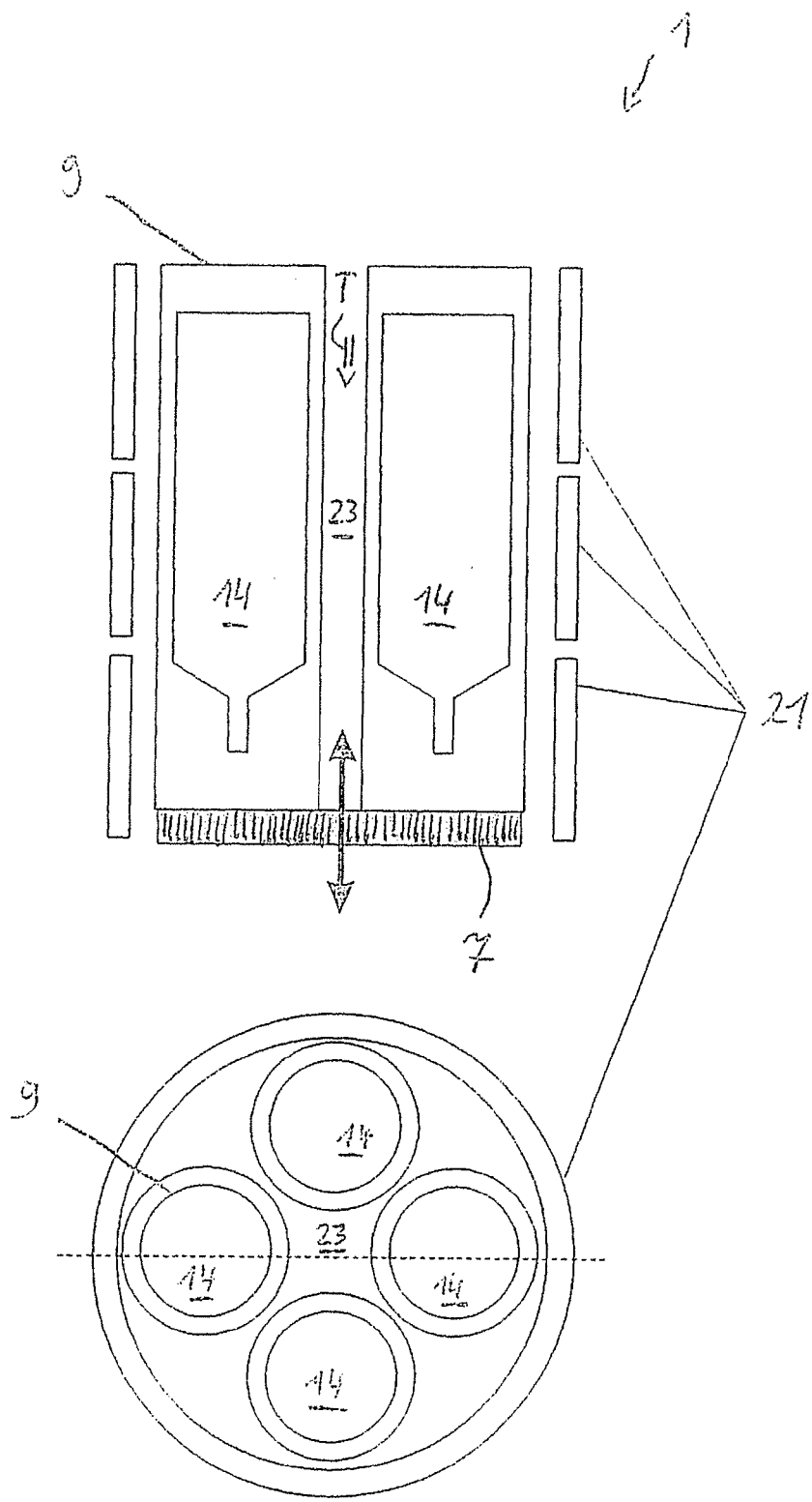
FIG. 3 shows an arrangement similar to FIG. 1, wherein a VB-furnace (Vertical Bridgman) is realized.

In contrast thereto the crucibles may also be displaced axially, i.e. in field gradient direction, within a locally fixed temperature field T in the case of Bridgman-like methods (for example vertical Bridgman, VB), wherein under circumstances the crucibles are also enclosed in each one gas-tight ampoule (see FIG. 3). In the arrangement 1 shown in FIG. 3, which may be realized with the invention, this is accomplished by means of a schematically shown moveable holder 7 and a motor (not shown).

Figure 4:
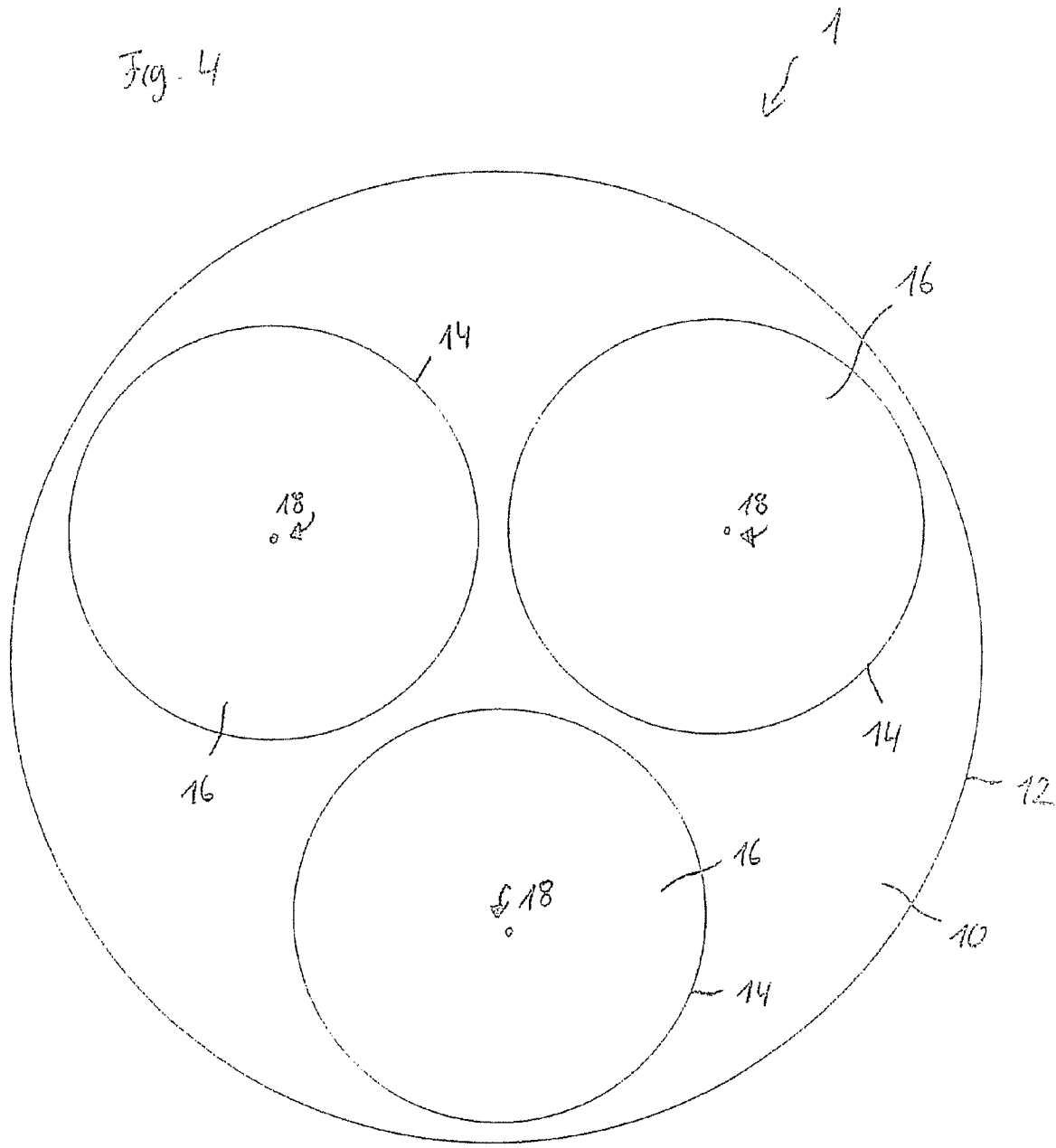
FIG. 4 shows a sectional view perpendicular to the longitudinal axis through a geometrically exemplary arrangement of 3 circular crucibles.
Figure 5:
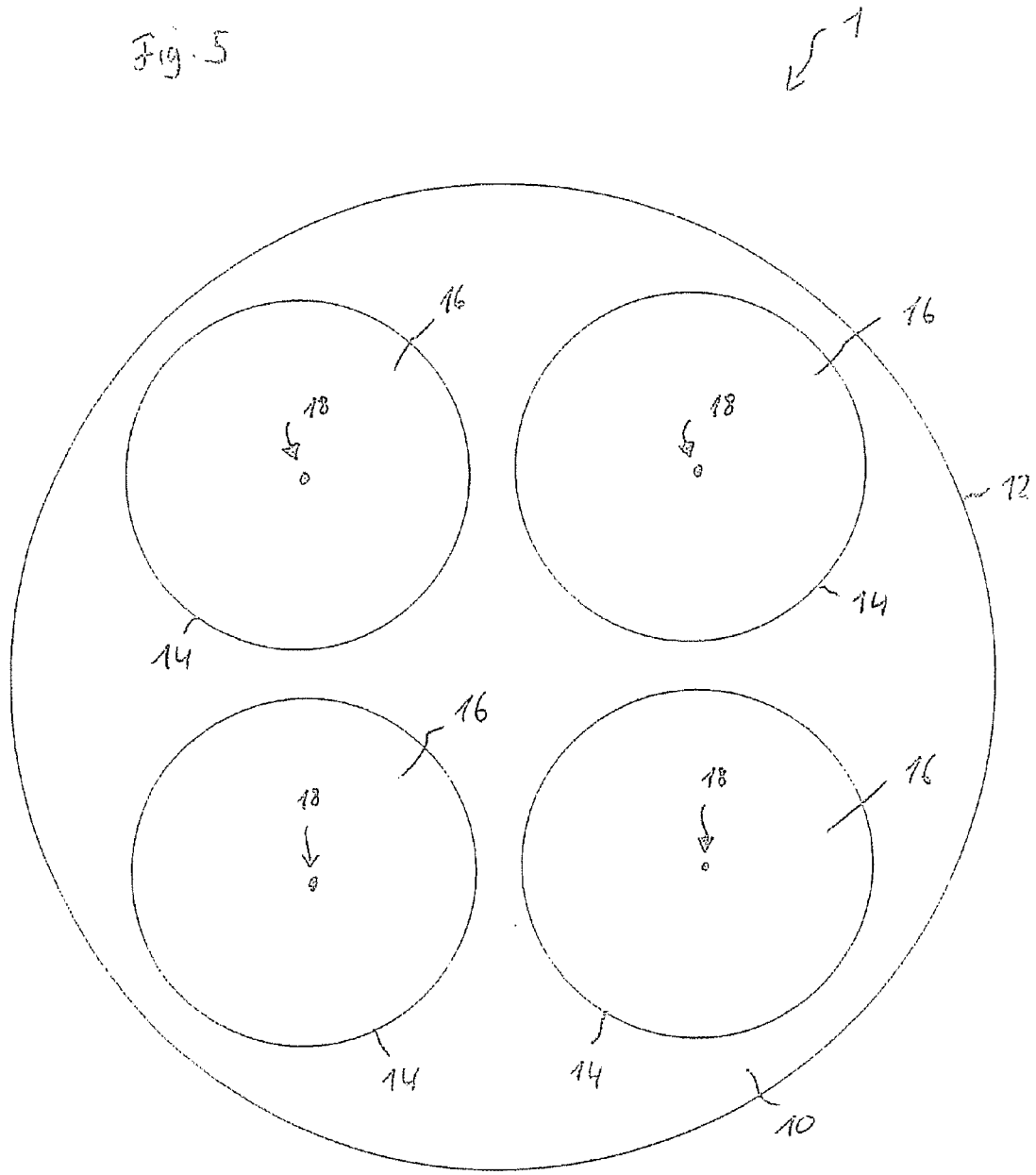
FIG. 5 similar to FIG. 4, but with 4 circular crucibles.
Figure 6:
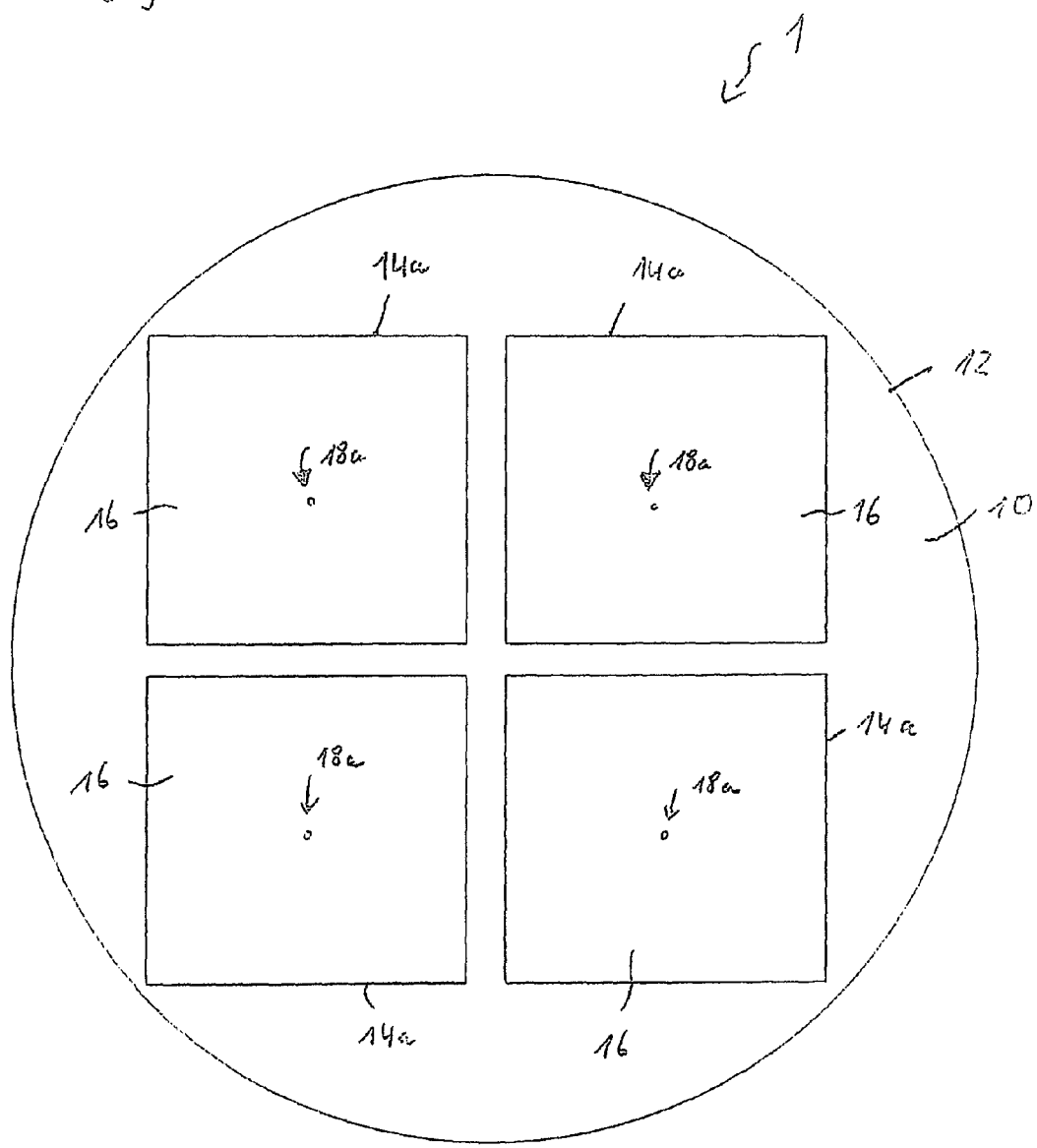
FIG. 6 similar to FIG. 4, but with 4 quadratic crucibles.

FIGS. 4 through 9 show further exemplary transverse sections of crucible arrangements (schematical top view), which may equivalently be employed in conjunction with the embodiments of the invention: shape, number and geometrical arrangement of the crucibles 14 may be varied according to the specific needs. FIG. 4 shows an arrangement 1 with three crucibles, FIG. 5 shows the above described arrangement of four crucibles. For the purpose of photovoltaic material, an arrangement of crucibles with quadratic transverse sections is conceivable (FIG. 6). In this case matrix-like arrangements with n times m (n=1, 2, 3, . . . ; m=2, 3, 4, . . . ) crucibles 14a may be considered. The longitudinal axis is denoted with numeral 18a in FIG. 6.

Figure 7:
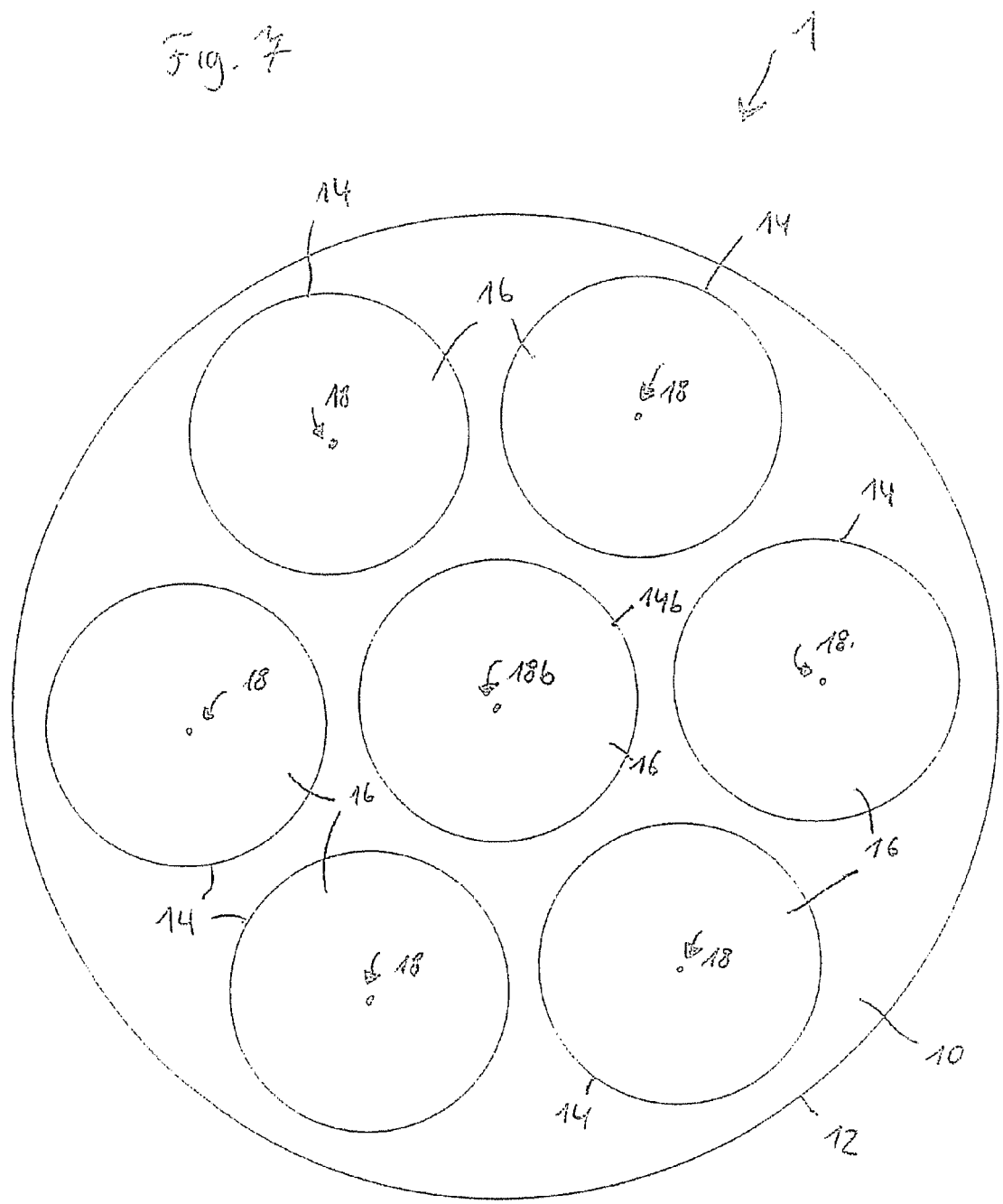
FIG. 7 similar to FIG. 4, but with a concentric arrangement of 7 circular crucibles.

FIG. 7 shows six crucibles 14 grouped concentrically around a centre crucible 14b. The arrangement is rotational symmetric around an axis 18b, which is perpendicular to the plane of drawing in FIG. 7. The rotational symmetry facilitates easier handling of inhomogeneity effects, because the environmental conditions, which act in the crucibles 14 of one and the same circle, are nearly the same.

Figure 8:
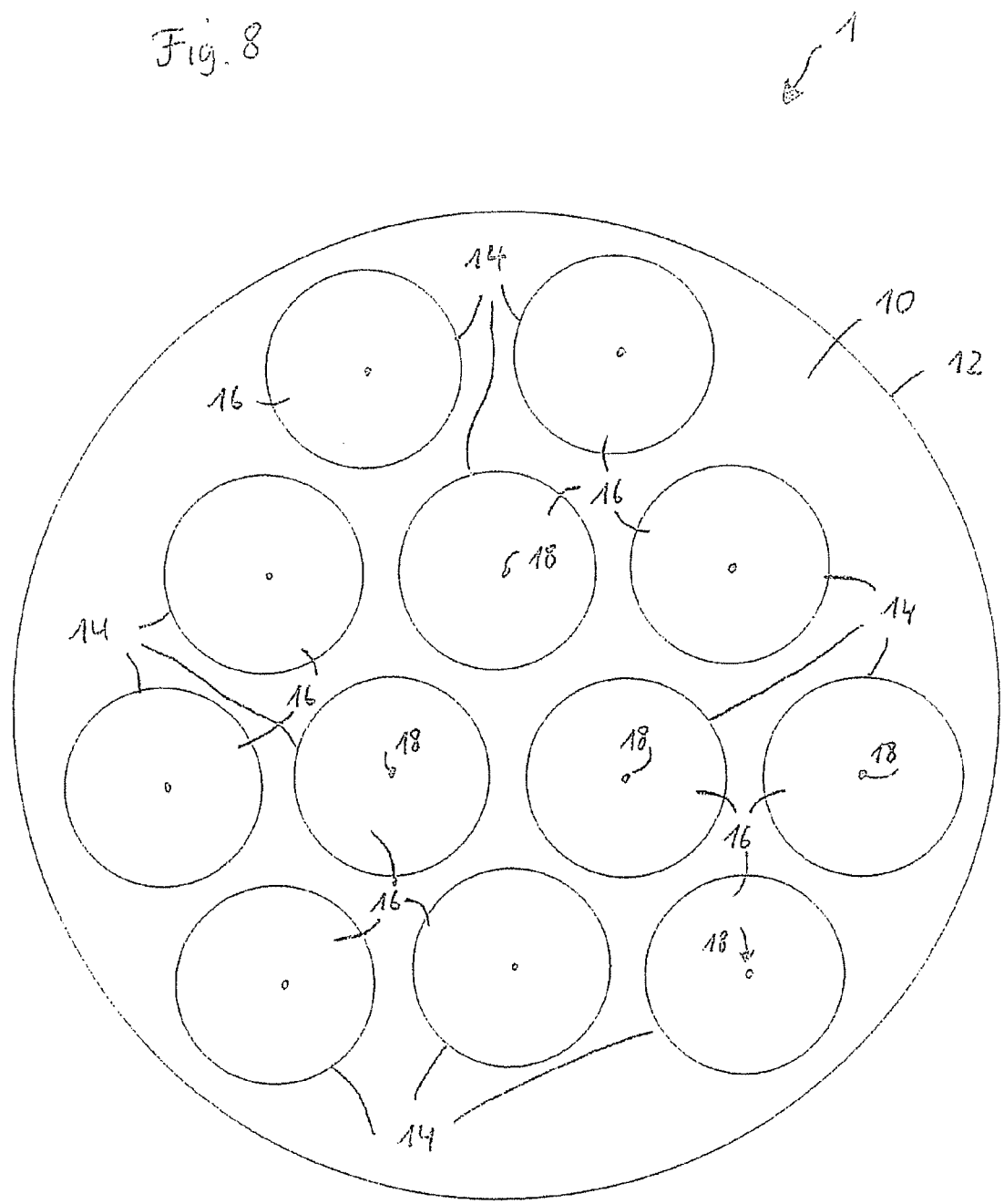
FIG. 8 similar to FIG. 4, but with a matrix-like, hexagonal arrangement of 12 circular crucibles.

FIG. 8 on the contrary shows a matrix-like, hexagonal arrangement 1 of crucibles 14. By this arrangement, a very high packing density of the crucibles 14 is achieved.

Figure 9:
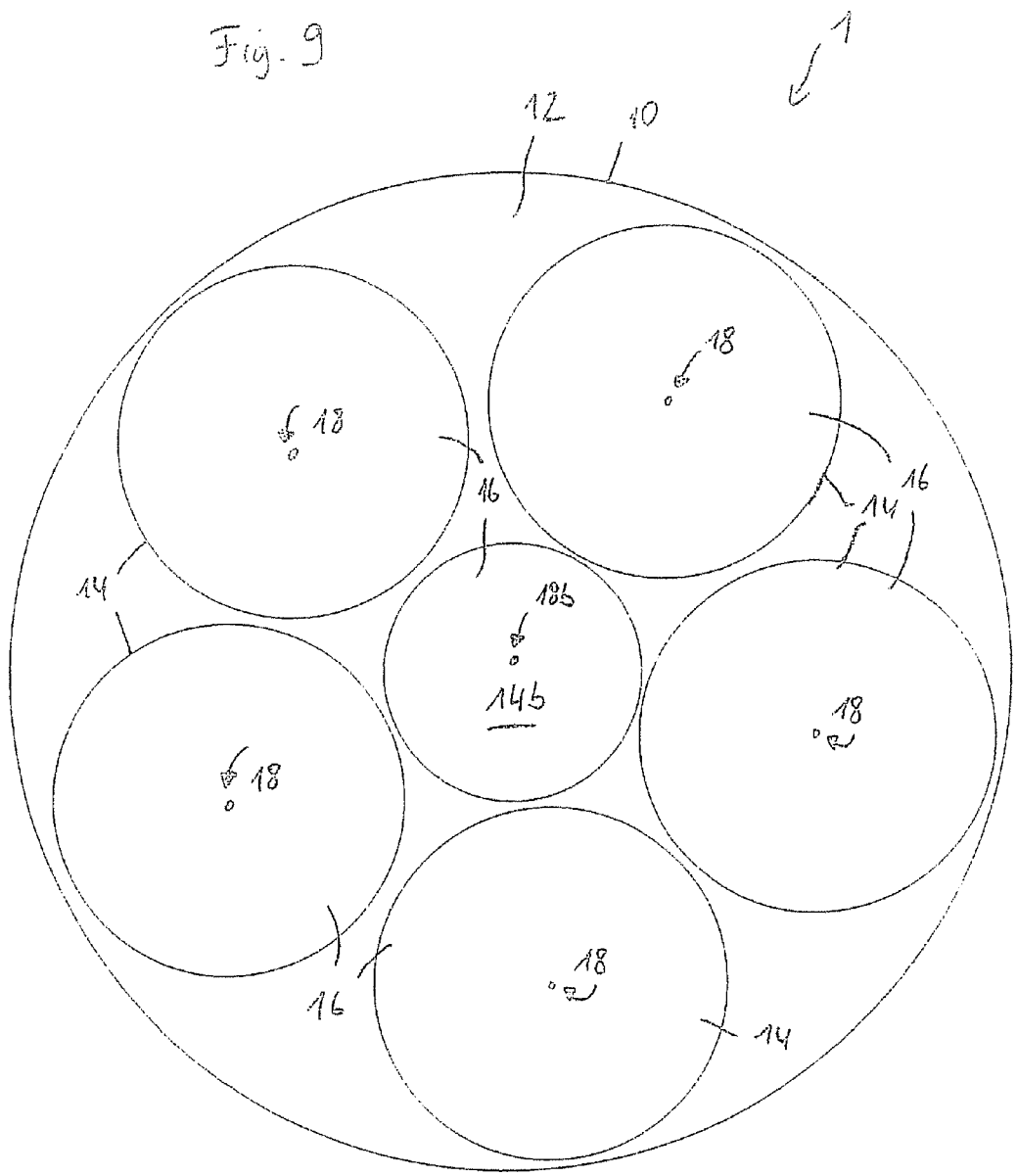
FIG. 9 similar to FIG. 7, but having a crucible in the centre being reduced in size.

The ratio of the length to the diameter of the crucibles is in each case larger than 1:1. The lengths and the diameters of the crucibles 14 relative to each other are preferably identical, however, the diameter of the crucibles may also be different as is shown in FIG. 9 with concern to the centre crucible 14b. The diameters of the crucibles according to the embodiments may amount to 3", 4", 6", 8" or larger. Of course intermediate values of the diameters are also possible.

The complete arrangement has a diameter, which is much larger than its height, the latter generally scaling with the length of the crucibles.

The walls of the crucibles may in each of the herein described embodiments be made from pBM (A. G. Fisher, *J. of Electr. Chem. Society*, 20(4), 1970; S. E. Bloom et al., *Brief Communications of the Electr. Chem. Society*, 20(4), 1972). The invention shall not be limited thereto.

It is an objective to form the temperature field, such that the desired material characteristics are maintained even when large crystals are to be grown simultaneously. To be more concrete, the following conditions are herein fulfilled:

1. The seed position is for all crucibles arranged in the same height relative to the direction of the temperature field. A stable and reproducable seeding is thus possible.
2. An axial heat flow (axial: in the direction of the temperature gradient), such that the freezing front is substantially flat and in addition as far symmetric as possible with respect to the axis of the respective crystallization crucible. Consequently, on the one hand side the thermo-elastic stress that may occur, is small. On the other hand side the variation of the most important characteristics of a wafer to be manufactures from the crystal subsequently (namely, the electrical resistance, the concentration of dopants, the residual stress, the dislocation density, etc.) has to be restrained in acceptable limits.

A first embodiment compatible with each of the arrangements shown in FIGS. 1-9 comprises a device for homogenizing the temperature field within a plane perpendicular to the direction of freezing, wherein the device includes thermotechnically optimised components. An embodiment is shown in FIG. 12. The components may be embodied as filling material bodies 24.

The spaces between the crucibles are filled with these specific filling material bodies 24. In particular, the filling material bodies 24 according to this embodiment may be adapted to the shapes of the interstitial spaces 23 (see for example FIGS. 1-3) between the crucibles. Preferably, the plurality of filling material bodies 24 are provided in manner being physically separated from each other. Each one is individually installable or detachable to/from the arrangement. By selecting filling material bodies 24 having different material characteristics regarding heat conduction, the heat flow within the full arrangement can be suitably controlled.

By this arrangement of the filling material bodies 24, an undesired heat transfer due to turbulent gas convection, which may occur in growth technologies under use of increased inert gas pressures, and possibly uncontrollable thermal radiation may be suppressed. The temperature field is thus only determined by the mechanism of heat conduction between the heat sources, namely the heaters, as well as by the latent heat of the phase transition and the heat sinks, namely the cooled walls 12 of the arrangement 12.

Due to the filling material bodies 24 a breakdown of rotational symmetry, which is typical for one-crucible-arrangements, can be compensated in relation to the longitudinal—or rotational axis 18 of the crucibles. As materials for the filling material bodies 24 there are particularly suited those, which have a heat conduction capability adapted to that of the freezing substance. As an example, graphites, ceramics or fibre materials with adapted density may be employed.

According to one specific embodiment, filling material bodies 24 having an anisotropic heat conduction capability may be utilized. If seen in the direction of freezing progress (direction of temperature gradient, or "axial direction" due to the axial symmetry of the (main-)crucibles), the heat conduction corresponds to that of the freezing material. However, perpendicular thereto (i.e., in the plane shown in FIGS. 4-9, or: in radial direction) the heat conductivity in the filling material bodies 24 is comparatively large. As a result the temperature gradients in radial direction as seen from the rotational axis 18 are suppressed.

Fibre materials or composite materials with specifically oriented fibres (ceramic fibre materials or carbon fibre consolidated materials) or laminated composite materials fulfil these requirements. The basic characteristic of those materials are known to the person skilled in the art who tries to re-work the invention according to the instructions provided herein.

In particular, graphite may be manufactured having such characteristics. These may be for example high temperature resistant graphite felts or -laminates having a heat conduction of about 20-40 W/mK within the laminate plane and 2-10 W/mK in direction perpendicular thereto. Such felts may be piled to yield stacks of felt layers. The materials may also be densified by, e.g., CVD processes to obtain differing densities. This may adversely lead to differing heat conductivities, respectively.

The orientation of the layers having the largest density manufactured either as a specific "gradient material" or as a mere combination of distinct layers—also determines direction of the largest heat flow. In other words, more effectively isolating intermediate layers reduce the heat flow in a direction perpendicular to the corresponding layer.

Graphite materials having an anisotropic heat conductivity may be obtained, among others, from Calcarb Ltd, Bellshill, North Lanarkshire, Scotland, UK, or Schunk Graphite Technology, LLC, Menomonee Falls, Wis., US, or SGL Carbon AG, Wiesbaden, Hessen, Del.

The arrangement according to a first embodiment (as well as the second embodiment) may for example be configured as in the case of a Tammann-Stöber-Construction for carrying the VGF-method, as will be described below in conjunction with a third embodiment.

FIG. 13 shows a modification of the example shown in FIG. 12, wherein the crucibles 14 are arranged each in one gas-, pressure- and vacuum-tight ampoule 9. The filling material bodies 24 thereby fill out the interstitial spaces between the ampoules.

A second embodiment similar to the previous embodiment is shown in FIG. 14 and is related to the insertion of interstitial crucibles 26 into the spaces 23 between the crucibles 14.

The spaces between the crystallization crucibles are filled with specifically shaped crucibles 26, which contain a similar or the same material as those in the (main-)crucibles 14 that is to be crystallized, and which are herein also referred to as filling crucibles. A specific advantage arises due to the existence of the same thermo-physical parameters. The material in the filling crucibles may repeatedly be employed as a melt and does hardly age.

For example the melt 16 within the main crucibles 14 may substantially contain GaAs and the melt 16 within the interstitial crucibles 26 may equivalently comprise GaAs.

A further advantage is, that the material in the filling crucibles also freezes such that in direct neighbourhood to the growing crystals latent heat is set free. The corresponding vertical temperature profile can not be reflected by other filling materials than the melting material itself in view of the specific latent heat of the melt. Undesired radio heat fluxes may thus be compensated. As a result, the curvature 33 of the phase interface (see FIG. 10 or 11) is thus advantageously alleviated.

The first and second embodiments are compatible with the arrangements shown in FIGS. 1-9 of the crucibles in the furnace 10. However, the embodiments may also be modified according to the invention.

Figure 10:
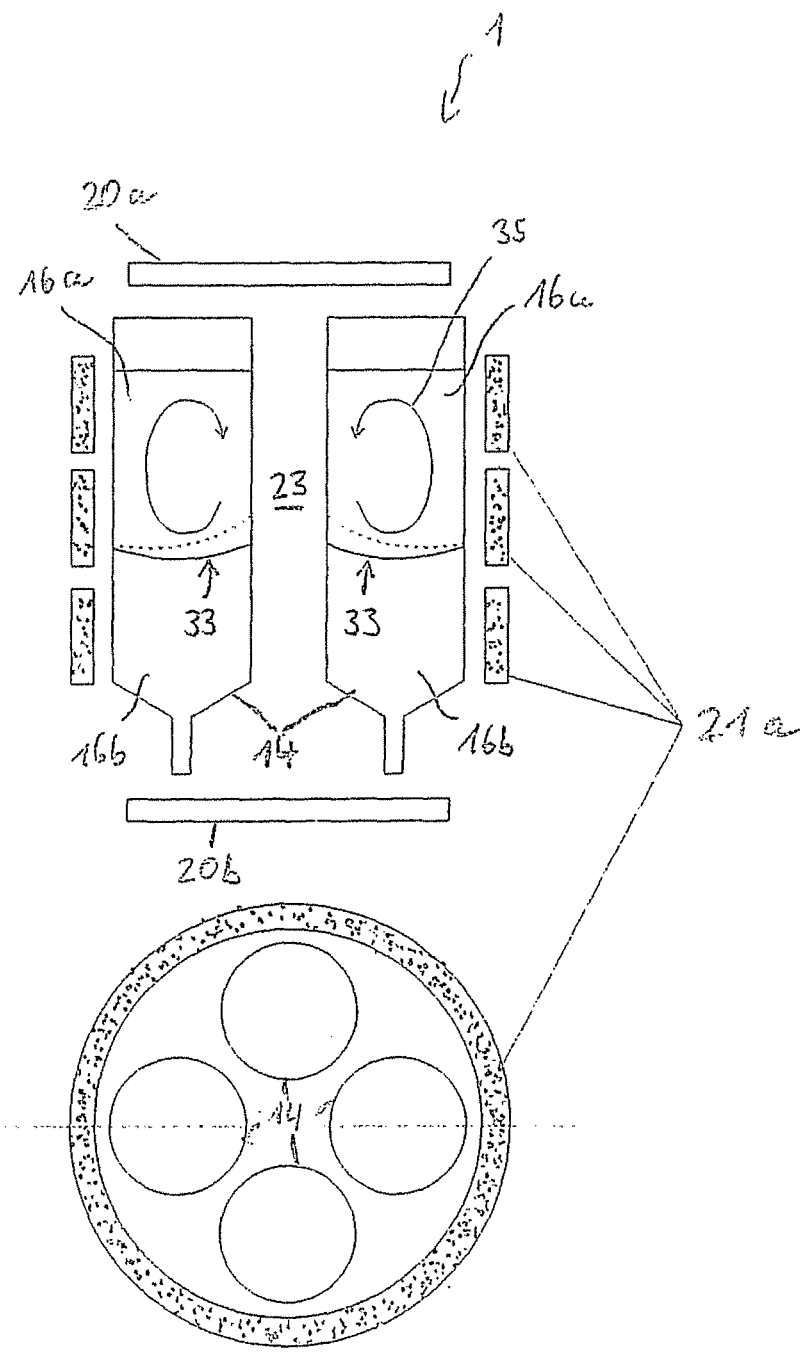
FIG. 10 similar to FIG. 1, wherein the peripheral jacket heaters are embodied as devices for generating magnetic migration fields for a selected formation of convection in the crucibles, according to a first embodiment of the invention.

A third embodiment is shown in FIG. 10. The third embodiment provides as a specific feature a device 21a for generating magnetic migration fields. Due to the characteristics of the melting material, the same material responds to those fields, such that a convection may be effected within the melts of the individual growth crucibles 14. The convections may counteract the breakdown of symmetry due to the parallel arrangement of the crucibles.

In the embodiment of FIG. 10 an arrangement for VGF-growth of GaAs in a Tamann-Stöber-Configuration is shown (for Tamann-Stöber-Configuration: see Wilke, K.-Th. und J. Bohm in "*Kristallzüchtung*", Ed. K.-Th. Wilke, First Edition VEB Deutscher Verlag der Wissenschaften, 1973-1-922). There are provided 3 active resistance heaters, i.e., cover heater 20a, devices 21a for generating magnetic migration fields being configured as jacket heaters, and floor heaters 20b.

Between the cover heater and the floor heater a temperature gradient is configured. The device 21a acts as in the case of a conventional jacket heater 21 as described above against radial heat fluxes. Within this heater arrangement multiple crucibles with diameters of for example 3×200 mm, 4×150 mm, 6×125 mm, 12×100 mm or 12×75 mm are provided (see FIGS. 4-9). The crucibles 14 are as in the case of the other embodiments positioned in symmetric configuration.

In this arrangement 1, the magnetic field heater 21a is configured such that the shape of the phase interface relative to the axis 18 of each one crucible is made symmetric (see FIG. 6). Magnetic field heaters 21*a* are for example described in document WO 2005/041278 A2. Within a high pressure vessel 8, graphite rods are arranged in helical form around a crucible, such that three sections are formed, which each represent a coil. Applied with phase shifted voltage (rotary current) these coils serve to generate suited magnetic migration fields. An additional supply of DC current secures a resistance heating in the coils.

For the embodiment according to the invention, a magnetic field heater of the described type is realized, such that it surrounds the symmetric arrangement of crucibles as a whole within the high pressure vessel, i.e. not each crucible individually. This arrangement is limited to cases, in which the crucibles are configured on one circle around the symmetry axis of the arrangement of crucibles at the maximum. One further crucible may advantageously be placed in the centre of symmetry of the arrangement.

Figure 11:
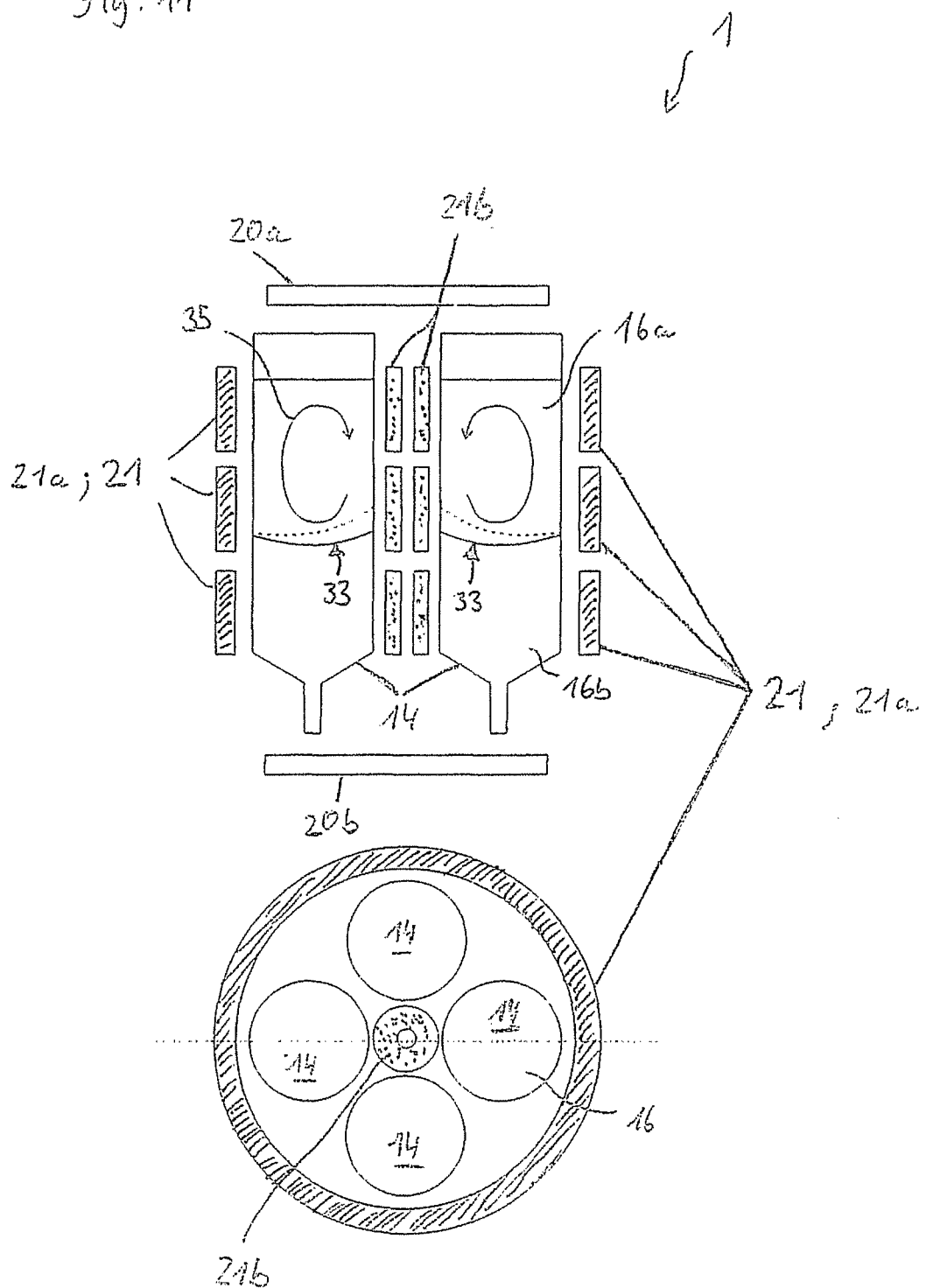
FIG. 11 similar to FIG. 1, wherein in addition to the peripheral jacket heaters, devices for generating magnetic migration fields are provided in the centre of the furnace, according to a second embodiment of the invention.

Still further, instead of arranging a centre crucible, a further magnetic field arrangement (magnetic field heater 21*b*) may be inserted to support, or attenuate, respectively, the peripheral magnetic field, in order to further influence the phase interfaces between the melted and crystallized material. A similar arrangement is shown in FIG. 11 (therein with conventional jacket heaters 21 at the periphery or alternatively with magnetic field heaters 21*a*). At this time the generation of magnetic fields may be taken over as a whole or in parts by the inner or the peripheral magnetic field arrangement.

In the peripheral crucibles (see FIG. 5) the rotating or migrating magnetic field (RMF) drives a convection roll 35 at the dimension of some Mt (see FIGS. 10, 11), which effects an additional heat transport within the melt 16*a* above the crystallized material 16*b*. This heat flux can be dimensioned, such that it counteracts an asymmetric formation of the phase interface 33. The asymmetric formation would else develop due to a stronger convection of gas in a centre space 23 of the arrangement as compared with a small space between the crucibles and the peripheral jacket heater.

Regarding various materials the structural perfection and the electrical homogeneity are characteristics contradicting each other. This may substantially be ascribed to the known interaction between extrinsic or intrinsic point defects, which are responsible for the electrical and optical material characteristics, and the structural defects such as dislocations or grain boundaries. Herein, micro segregation may be observed. If structural defects are now very dense, the concentration inhomogeneities may become small and the homogeneity of the electrical or optical characteristics may become large. In the reverse case the mean distances between structural defects may become large such that in response to micro segregation large differences in concentration for point defects may occur. In what follows, some known measurement methods for important characteristics of single crystals yielded by the present arrangement and of the corresponding homogeneities are described:

Specific electrical resistance $\rho$ and the density of impurities related to the EL2-level pertain to the parameters describing the electrical characteristics.

The position resolving measurement of the specific electrical resistance p may be performed by the so-called COREMA (COntactless REsistivity MApping: Jantz, W. and Stibal, R. in: "*Contactless Resistivity Mapping of Semi-Insulating Substrates*". III-V s. Review 6[4], 38-39. 1993; and Stibal, R., Wickert, M. Hiesinger, P., and Jantz, W. in: "*Contactless Mapping of Mesoscopic Resistivity Variations in Semi-Insulating Substrates*", Materials Science and Engineering B66 [1-3], 21-25, 1999). A typical positional resolution achieved by the method is in the range of about 1 mm$^2$, wherein the mapping covers the whole area.

The lateral distribution of impurities EL2, which become particular important with respect to GaAs, may be measured by a positionally resolved transmission measurement at a wavelength of 1.000 nm (Wickert, M., et al. in "*High Resolution EL2 and Resistivity Topography of SI GaAs Wafers*", IEEE, Inc., 1998, V 21-24; Wickert, M., et al. in "*Comparative High Resolution EL2 and Resistivity Topography of Semi-Insulating GaAs Wafers*", Jun. 1, 1998 Piscataway N.J.: IEEE Inc., 1999).

Equivalently, the mechanical residual stress of wafers plays an important role with regard to further processing. Such stress arises, when the thermo-elastic stress relaxes upon cooling of the crystals at enhanced temperatures due to the formation of dislocations. It becomes clear that the residual stress measured at a room temperature strongly depends on the configuration of the temperature field during growth and cooling of the crystals. The residual stress of wafers may be measured by depolarisation of polarized light in a stressed medium. In "Photo-elastic Characterization of Residual Stress in GaAs-Wafers", H. D. Geiler, et al., Materials and Science in Semiconductor Processing 9 (2006) p. 345-350 a method for positionally resolved measurement of this depolarisation is described, which allows to measure components of the residual stress. All values as provided herein are obtained according to the method disclosed therein.

Another parameter related to the residual stress, is the dislocation density or the density of grain boundaries. It may be represented for example by the etch pit density (epd). Therein the plane wafer surface is exposed to an etch material containing KOH, wherein at points of the dislocations piercing the surface, recesses (pits) are etched into the surface, which then may be counted together to determine the area density.

The determination of standard deviations is accomplished according to the following mathematical scheme (at the example of the specific electrical resistance $\rho$):

The measurement data of the points were divided: for each point (x, y) in the wafer plane (the grown crystal has to be sawn therefore), a regression plane has been calculated from the measurement data of those neighbouring points, which are located within a circle with radius $\zeta$:

$$\rho_{measured} = \rho_{regression\ plane} + \rho_{variation}$$

The measured resistance is then expressed as a sum of two addends. Therein, $\rho_{regression\ plane}$ represents the value of the regression plane in the point (x, y) and $\rho_{variation}$ denotes the distance between the function value of the regression plane and the measured value.

A least-squares fit of a plane $\rho(x, y) = a + bx + cy$ for M data points can be obtained uniquely by solving the linear equation system:

$$\begin{pmatrix} N & \sum x_i & \sum y_i \\ \sum x_i & \sum x_i^2 & \sum x_i y_i \\ \sum y_i & \sum x_i y_i & \sum y_i^2 \end{pmatrix} \begin{pmatrix} a \\ b \\ c \end{pmatrix} = \begin{pmatrix} \sum \rho_i \\ \sum x_i \rho_i \\ \sum y_i \rho_i \end{pmatrix}$$

For the homogeneities on the different length scales it may now be defined:

The total standard deviation:

$$\sigma_{total} = \sqrt[2]{\frac{\sum_{i=1}^{N}(\rho_i - \overline{\rho})^2}{N-1}} \text{ with } \overline{\rho} = \frac{1}{N}\sum_{i=1}^{N}\rho_i;$$

The local standard deviation:

$$\sigma_{local} = \sqrt[2]{\frac{\sum_{i=1}^{N}(\rho_i - \rho_{p_i})^2}{N-1}},$$

with $\rho_{p_i}$ being the function value of the regression plane in the point $(x_i, y_i)$; and the global standard deviation:

$$\sigma_{global} = \sqrt[2]{\frac{\sum_{i=1}^{N}(\rho_{p_i} - \overline{\rho}_p)^2}{N-1}}, \text{ with } \overline{\rho}_p = \frac{1}{N}\sum_{i=1}^{N}\rho_{p_i}.$$

For a more detailed discussion, the measurement quantity (the parameter) is investigated on different length scales. Herein, an area having the dimension of a few dislocation cells or grains (the radius $\zeta$ amounts to 5-10 mm) is denoted as local. Variations occurring on the whole wafer and obtain with minimum resolution of radius $\zeta$ are denoted as global. The variations on different length scales may be based upon different physical causes.

In order to arrive at a separate inspection of local and global variations of a quantity (of the measured parameters) the measurement of mappings with high lateral resolution is necessary. Measurement fields having a smaller distance towards the wafer edge as the edge exclusion are not considered in the analysis.

In the approach proposed herein two quantities may be fixed: the edge exclusion and a characteristic length $\zeta$. The numerical calculation of the quantities is then uniquely fixed and can be reproduced by everyone.

It is noted that as an alternative to the proposed approach a Fourier filtering is also possible.

It has now been found out that the invention achieves particularly outstanding characteristics of the obtained crystals with regard to the homogeneity of the electrical as well as the mechanical-structural parameters. This becomes particularly valid for the global (non-local) variations across the wafer surface.

Regarding the COREMA-mapping the global variation of the specific electric resistance $\rho$ is dominated by a slow variation of the defect budget, while local variations are dominated by variation of the concentration of impurities EL2 with the dislocation structure. The global variations are larger than the local ones, such that the standard deviation over all measurement values of the specific electrical resistance rather becomes a measure for the global variation. Local variations thus were hitherto hardly considered.

With concern to the determination of the etch pit density (epd), the standard deviation of all measurement values strongly depends on the size of the measurement field. The variation from measurement field to measurement field is quite large, such that in contrast to the COREMA-mapping the standard deviation over all values reflects the local fluctuation. Consequently, the global variation has in this regard hitherto been hardly considered.

The distributions of shear stress of wafers (being cut perpendicular to the crystal axis) can be measured with SIRD™ (PVA TePla AG) and analysed statistically. A Lorentz-distribution is yielded which is formed symmetrically about zero. The full width at half maximum of the distribution may be interpreted as a measure of the local stress of the materials.

As measurement results for the homogeneity of the resistance in the case of GaAs, the following exemplary values of the standard deviation—related to the mean value of the resistance—were obtained for a 6"-VGF-wafer:

$\sigma_\rho \text{total} = 6.5\%$ $\sigma_\rho \text{global} = 5.3\%$ $\sigma_\rho \text{local} = 2.5\%$ For specific arrangements according to the invention, even the following values were obtained:

$\sigma_\rho \text{total} = 4.5\%$ $\sigma_\rho \text{global} = 2.8\%$ $\sigma_\rho \text{local} = 1.25\%$ Each of the measurements has been performed with a resolution of 200×200, an averaging over length $\zeta = 10$ mm and an etch exclusion of 3 mm.

With regard to the homogeneity of the epd-count (etch pit density) the following standard deviations (as above relative to a mean for GaAs) were obtained:

$\sigma_{epd}\text{total} = 90\%$ $\sigma_{epd}\text{global} = 23\%$ $\sigma_{epd}\text{local} = 86\%$ For specific arrangements according to the invention even the following values were obtained:

$\sigma_{epd}\text{total} = 76.0\%$ $\sigma_{epd}\text{global} = 17.6\%$ $\sigma_{epd}\text{local} = 67.0\%$ An averaging was performed herein over lengths $\zeta = 5$ mm with an etch exclusion area on the wafer of 3 mm. The mapping was carried out on areas having a size 500×500 μm (whole area).

Further, the homogeneity of the density of impurities EL2 has been determined for 6'-VGF-wafer. For this purpose 256 detectors were arranged linearly on a bar having a width of 7.5 mm. The mapping was carried out on the whole area. As an etch exclusion a band of 3 mm width has been fixed. The step width in x-direction amounted to 570 μm. In y-direction the resolution has been adapted by forming the arithmetic mean. Therein, 21 bands with each 256 measurement points, i.e. N=5376 data points, were obtained in y-direction. Each k(i) subsequent values were combined by forming the mean:

$k(i) = \text{floor}(i \times 256/N) - \text{floor}((i-1) \times 256/N),$ $i = 1 \ldots N$ The function floor (x) corresponds to the German "Gauss Klammer".

The following values were obtained for the standard deviation (in percent related to the mean value, for GaAs):

$$\sigma_{E12}\text{total}=10.7\%.$$

For the local and global values is obtained in relation thereto:

$$\sigma_{E12}\text{global}<0.8*\sigma_{E12}\text{total}$$

$$\sigma_{E12}\text{local}<0.7*\sigma_{E12}\text{total}.$$

Herein, an averaging overlength of σ=10 mm and an edge exclusion area on the waver of 3 mm has been employed.

Further, the homogeneity in view of rocking-curve-mappings obtained by means of the arrangement according to the invention has been determined. The rocking-curve-mappings were recorded using a commercially available, high resolution X-ray diffractometer, which utilizes Cu—Kα₁ radiation and is provided with a collimating optics on its entry side. The step width in ω is selected such that the full width at half maximum covers at least 6 measurement points, i.e. the full width amounts to 1.5 arcsec at maximum. At the measurement on the sample surface, the {004} reflex (rocking direction <110>) is employed and the step width in x- and y-direction amounts to 2×2 mm at maximum. The analysis is based on at least 2.000 counts in the maximum. The lateral dimensions of the X-ray focus lie at <1 mm (scattering plane) or 2 mm (perpendicular to scattering plane) on the surface. The edge exclusion area amounted to 2 mm from the wafer edge. The determination of the full width at half maximum (FWHM) is carried out without correcting the resolution function.

The distribution of the rocking-curve-line width found its maximum according to the measurement results at about 10 arcsec. The full width at half maximum of the distribution of measured full widths at half maximum amounted to about 1 arcsec (roughly 10 percent). Less than one tenth of a percent of the FWHM exceeded 15 arcsec. The maximum measured FWHM achieved less than 18 arcsec.

The following values were obtained for the standard deviation (in percent, related to the mean value for GaAs):

$$\sigma_{FWHM}\text{total}=7.0\%$$

The local and global values obtained in relation thereto are:

$$\sigma_{FWHM}\text{global}<0.8*\sigma_{FWHM}\text{total}$$

$$\sigma_{FWHM}\text{local}<0.6*\sigma_{FWHM}\text{total}.$$

An averaging was carried out herein over length θ=10 mm with an edge exclusion area on the wafer of 2 mm.

Further, the shear stress of crystals manufactured according to the invention was determined. With an edge exclusion of nm and a measurement resolution of 200 μm×200 μm there was yielded an adaptation of the Lorentz-distribution full width at half maximum of less than 100 kPa and for specific arrangement of less than 65 kPa.

This application claims priority from U.S. Provisional Application No. 60/942,298, filed Jun. 6, 2007 and German Patent Application No. 10 2007 026 298.3 filed Jun. 6, 2007, which are incorporated herein by reference in their entirety.

The invention claimed is:

1. Arrangement for manufacturing a crystal from the melt of a raw material, comprising:
a furnace including a heating device having one or more heating elements, which are configured to generate a gradient temperature field in the furnace which is oriented in a first direction;
a plurality of at least two crucibles for receiving the melt, the crucibles being arranged in the gradient temperature field side by side; and
a device for homogenizing the temperature field within a plane perpendicular to the first direction within the at least two crucibles,
wherein the device for homogenizing the temperature field comprises a filling material, which is arranged within a space between the crucibles,
wherein the filling material shows an anisotropic heat conductivity, and
wherein the device for homogenizing the temperature field further comprises a device for generating magnetic fields.

2. The arrangement according to claim 1, wherein the crucibles are each arranged within a gas-, vacuum- and/or pressure-tight ampoule, and the filling material is inserted between the gas-, vacuum- and/or pressure-tight ampoules and externally from the ampoules.

3. The arrangement according to claim 1, wherein the crucibles are collectively arranged within one gas-, vacuum- and/or pressure-tight vessel, and the filling material is arranged within the vessel between the crucibles.

4. The arrangement according to claim 1, wherein the filling material has a heat conductivity coefficient, which is adapted to the material of the melt.

5. The arrangement according to claim 1, wherein the filling material comprises a graphite, ceramic, or fiber material.

6. The arrangement according to claim 1, wherein a first component of the heat conductivity along the first direction is smaller than the heat conductivity coefficient of the material of the raw melt contained in the crucibles.

7. The arrangement according to claim 6, wherein a second component of the heat conductivity within a plane perpendicular to the first direction is larger than or equal to the heat conductivity coefficient of the material of the raw melt contained in the crucibles, in order to enable a fast temperature compensation between the crucibles within this plane.

8. The arrangement according to claim 7, wherein the filling material is a fibre material or a laminated composite material.

9. The arrangement according to claim 1, wherein the characteristics of the filling material in the centre of the arrangement are different from those in the peripheral area.

10. The arrangement according to claim 1, wherein the crucibles are arranged symmetrically in an azimuthal direction around a common centre point.

11. The arrangement according to claim 10, wherein the crucibles are arranged symmetrically in one or more circles around the common centre point.

12. The arrangement according to claim 1, wherein the crucibles are placed in a hexagonal arrangement within the furnace.

13. The arrangement according to claim 1, wherein the crucibles comprise a rectangular shape in a transverse section along the plane perpendicular to the first direction and are arranged matrix-like in rows and columns with each at least two crucibles.

14. The arrangement according to claim 1, wherein the crucibles are arranged in circular form within the furnace and wherein a further crucible is arranged in the centre of the circle of crucibles.

15. The arrangement according to claim 1, wherein the device for generating magnetic fields is arranged within the gas-, vacuum- and/or pressure-tight vessel enclosing the crucibles.

16. The arrangement according to claim 1, wherein the device for generating magnetic fields is arranged externally from the plurality of crucibles and acts on these from externally.

17. The arrangement according to claim 1, wherein the device for generating magnetic fields is arranged in the centre of the plurality of crucibles and acts upon these.

18. The arrangement according to claim 1, whose length as measured along the first direction amounts to less than its width in a plane perpendicular to the first direction.

19. The arrangement according to claim 1, wherein the filling material includes a number of separately provided filling bodies, which are detachably provided within the spaces between the crucibles of the arrangement independently from each other.

20. The arrangement according to claim 19, wherein for at least two of the filling bodies the material characteristics regarding heat conductivity are selected to differ from each other.

21. The arrangement according to claim 1, wherein the arrangement is configured to manufacture single crystals of the compound semiconductors of the groups II-VI, IV-IV or III-V, particularly GaAs, CdTe or InP, or of Ge or Si.

22. The arrangement according to claim 1, wherein the arrangement is configured to manufacture a polycrystalline material having quadratic or rectangular sectional profiles of at least 100 x 100 mm or 125 x 125 mm or 150 x 150 mm.

23. The arrangement according to claim 1, wherein the arrangement is configured to manufacture single crystals having a diameter of 3', 4', 6' or 8' or of intermediate values amounting therebetween.

24. The arrangement according to claim 1, wherein the heating device comprises a floor heater and a cover heater as heating elements.

25. The arrangement according to claim 1, wherein the heating device comprises one or more jacket heaters as heating elements.

26. Method for manufacturing a crystal from the melt of a raw material, which is carried out using the arrangement according to claim 1.

27. Arrangement for manufacturing a crystal from the melt of a raw material, comprising:
- a furnace including a heating device having one or more heating elements, which are configured to generate a gradient temperature field in the furnace which is oriented in a first direction;
- a plurality of at least two crucibles for receiving the melt, the crucibles being arranged in the gradient temperature field side by side; and
- a device for homogenizing the temperature field within a plane perpendicular to the first direction within the at least two crucibles,
wherein, the device for homogenizing the temperature field comprises a filling material, which is arranged within a space between the crucibles,
wherein the filling material shows an anisotropic heat conductivity, and
wherein the filling material comprises the same material as the raw melt.

28. The arrangement according to claim 27, wherein the filling material comprising the same material as the raw melt is filled in interstitial crucibles, wherein the external shape is adapted to that of the plurality of crucibles, in order to fill out the space between the crucibles or in the case of the gas-, vacuum- and/or pressure-tight ampoules fills out the space between the ampoules containing the crucibles.

29. Arrangement for manufacturing a crystal from the melt of a raw material, comprising:
- a furnace including a heating device having one or more heating elements, which are configured to generate a gradient temperature field in the furnace which is oriented in a first direction;
- a plurality of at least two crucibles for receiving the melt, the crucibles being arranged in the gradient temperature field side by side; and
- a device for homogenizing the temperature field within a plane perpendicular to the first direction within the at least two crucibles,
wherein the device for homogenizing the temperature field comprises a filling material, which is arranged within a space between the crucibles,
wherein the filling material shows an anisotropic heat conductivity, and
wherein the filling material is a fibre material or a laminated composite material.

30. Arrangement for manufacturing a crystal from the melt of a raw material, comprising:
- a furnace including a heating device having one r more heating elements, which are configured to generate a gradient temperature field in the furnace which is oriented in a first direction;
- a plurality of at least two crucibles for receiving the melt, the crucibles being arranged in the gradient temperature field side by side; and
- a device for homogenizing the temperature field within a plane perpendicular to the first direction within the at least two crucibles,
wherein the device for homogenizing the temperature field comprises a filling material, which is arranged within a space between the crucibles,
wherein the filling material shows an anisotropic heat conductivity, and
wherein the filling material includes a number of separately provided filling bodies, which are detachably provided within the spaces between the crucibles of the arrangement independently from each other.

* * * * *

UNITED STATES PATENT AND TRADEMARK OFFICE
CERTIFICATE OF CORRECTION

PATENT NO. : 8,652,253 B2  
APPLICATION NO. : 12/133870  
DATED : February 18, 2014  
INVENTOR(S) : Eichler et al.

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1298 days.

Signed and Sealed this
Twenty-third Day of June, 2015

Michelle K. Lee
*Director of the United States Patent and Trademark Office*